United States Patent
Weng et al.

(10) Patent No.: US 7,193,282 B2
(45) Date of Patent: Mar. 20, 2007

(54) CONTACT SENSOR PACKAGE

(75) Inventors: Gwo-Liang Weng, Kaohsiung (TW); Che-Ya Chou, Kaohsiung (TW); Shih-Chang Lee, Kaohsiung (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 234 days.

(21) Appl. No.: 11/044,027

(22) Filed: Jan. 28, 2005

(65) Prior Publication Data

US 2005/0168906 A1    Aug. 4, 2005

(30) Foreign Application Priority Data

Jan. 30, 2004    (TW)    .............................. 93102125 A

(51) Int. Cl.
*H01L 27/14*    (2006.01)
(52) U.S. Cl. ...................... 257/414; 257/691
(58) Field of Classification Search ................ 257/691, 257/414
See application file for complete search history.

(56) References Cited

U.S. PATENT DOCUMENTS 6,028,773 A *    2/2000    Hundt ......................... 361/760
6,804,121 B2 *    10/2004    Fischbach et al. .......... 361/752

* cited by examiner

*Primary Examiner*—Roy Potter
(74) *Attorney, Agent, or Firm*—Bacon & Thomas, PLLC

(57) ABSTRACT

A contact sensor chip package includes a substrate, a contact sensor chip, a ground member and an encapsulation. The contact sensor chip is disposed on the substrate, and the contact sensor chip has a sensor area. The ground member is disposed on the ground pad of the substrate, and the ground member is electrically connected to the ground pad. The encapsulation covers the contact sensor chip and the ground member, wherein the sensor area of the contact sensor chip and a portion of the ground member are exposed out of the encapsulation.

9 Claims, 3 Drawing Sheets

CONTACT SENSOR PACKAGE

BACKGROUND OF THE INVENTION

1. Field of Invention

This invention relates to a contact sensor chip package. More particularly, the present invention is related to a contact sensor chip package with a ground member to eliminate static electricity remaining on the chip.

2. Related Art

The contact sensor chip packages are applied to many electrical devices, such as displays and fingerprint sensors. Due to the requirement of marketing, the circuits of the chips are designed to be very fine in order to process complex electrical signals.

However, when the users' fingers or other objects contact the sensor area exposed out of the encapsulation, the static electricity will be produced. The static electricity will cause the internal circuits of the chip being damaged. In the present technology, one of the methods for eliminating the static electricity remaining on the chip is to design special circuits in the chip. However, such design will increase the cost.

Consequently, providing a contact sensor chip package to solve the mentioned-above disadvantages is the most important task in this invention.

SUMMARY OF THE INVENTION

In view of the above-mentioned problems, an objective of this invention is to provide a contact sensor chip package with ground member to eliminate the static electricity on the chip.

To achieve the above-mentioned objective, a contact sensor chip package is provided, wherein the contact sensor chip package includes a substrate, a contact sensor chip, a ground member and an encapsulation. The contact sensor chip is disposed on the substrate, and the contact sensor chip has a sensor area. The ground member is disposed on the ground pad of the substrate and electrically connected to the ground pad. The encapsulation covers the contact sensor chip and the ground member, wherein the sensor area of the contact sensor chip and a portion of the ground member are exposed out of the encapsulation.

When the users contact the sensor area exposed out of the encapsulation, the static electricity due to friction will be eliminated through the ground member disposed on the ground pad of the substrate. Accordingly, the contact sensor chip will not be damaged by the static electricity remaining on the chip.

BRIEF DESCRIPTION OF THE DRAWINGS

The invention will become more fully understood from the detailed description given herein below illustrations only, and thus are not limitative of the present invention, and wherein.

DETAILED DESCRIPTION OF THE INVENTION

The contact sensor chip package according to the preferred embodiments of this invention will be described herein below with reference to the accompanying drawings, wherein the same reference numbers refer to the same elements.

Figure 1:
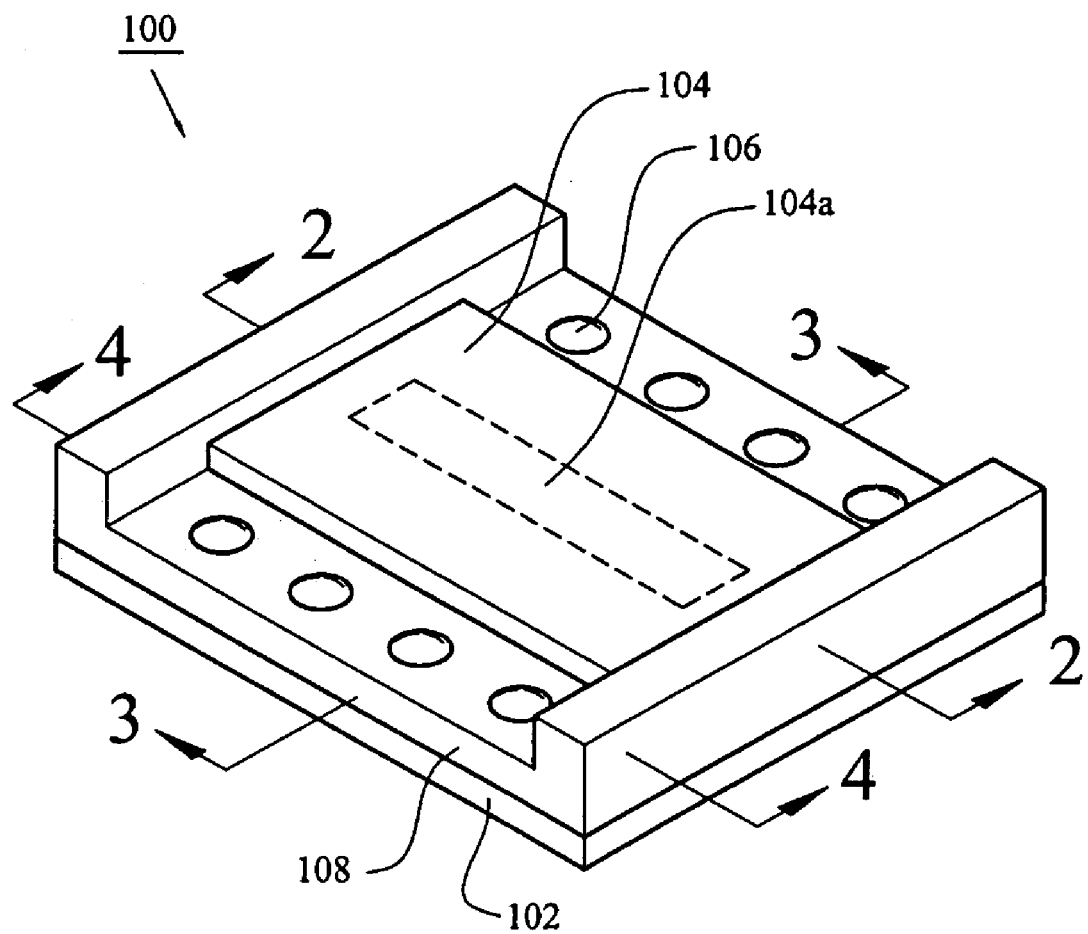
FIG. 1 is a perspective view of a contact sensor chip package according to the first embodiment.

In accordance with a first preferred embodiment as shown in FIG. 1, there is provided a contact sensor chip package 100. The contact sensor chip package 100 mainly comprises a substrate 102, a contact sensor chip 104, a plurality of ground members 106 and an encapsulation 108. The contact sensor chip 104 is disposed on the substrate 102. The ground members are disposed close to the contact sensor chip 104. The encapsulation 108 covers the contact sensor chip 104 and the ground member 106, wherein the sensor area 104a of the contact sensor chip 104 and a portion of the ground members 106 are exposed out of the encapsulation 108.

Figure 3:
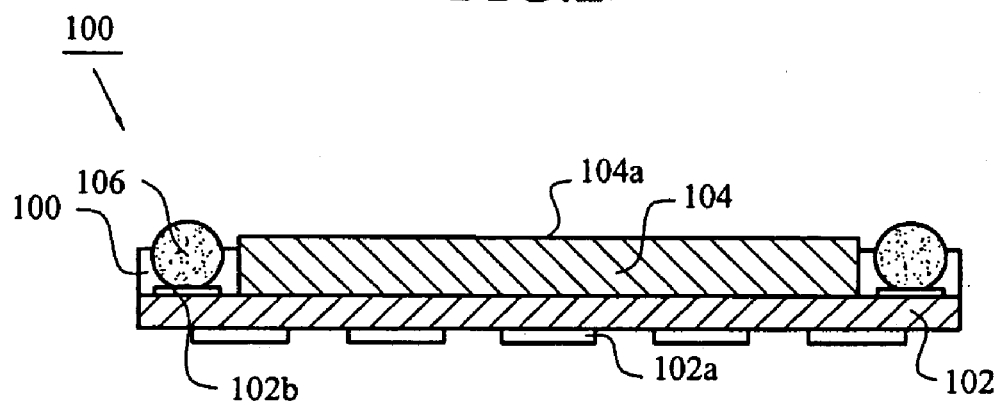
FIG. 3 is a cross-sectional view along line 3—3 of the contact sensor chip package according to the first embodiment of FIG. 1.

The substrate 102 can be a ceramic substrate, a glass substrate or an organic substrate. As shown in FIG. 3, the substrate 102 comprises a plurality of pads 102a and 102b. The pads 102a and 102b are respectively disposed on the upper and bottom surfaces. At least one of the pads 102a is ground pad, which is connected to the pad 102b through the electrical traces formed in the substrate 102.

Figure 2:
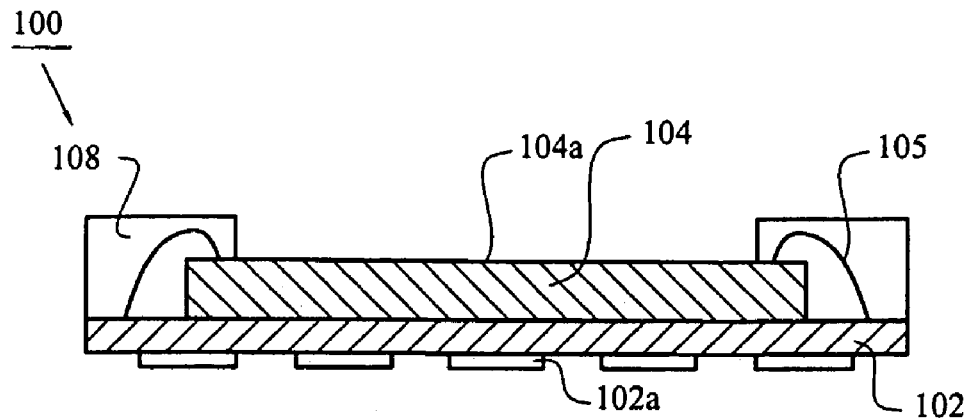
FIG. 2 is a cross-sectional view along line 2—2 of the contact sensor chip package according to the first embodiment of FIG. 1.

The contact sensor chip package 100 can be a fingerprint sensor chip package which is used for the personal identification and verification. In the embodiments, the contact sensor chip is a fingerprint sensor chip or other sliding contact senor chip. The contact sensor chip 104 has a plurality of sensor electrodes (not show in the figures), which are disposed on the sensor area 104a of the chip surface. FIG. 2 is a cross-sectional view along line 2—2 of the contact sensor chip package according to the FIG. 1. As shown in FIG. 2, the contact sensor chip 104 is electrically connected to the substrate 102 through the bonding wires 105. When the users' fingers or other objects contact the sensor area 104 exposed out of the encapsulation, the static electricity will be produced. The static electricity will cause the circuit of the chip being damaged.

Figure 4:
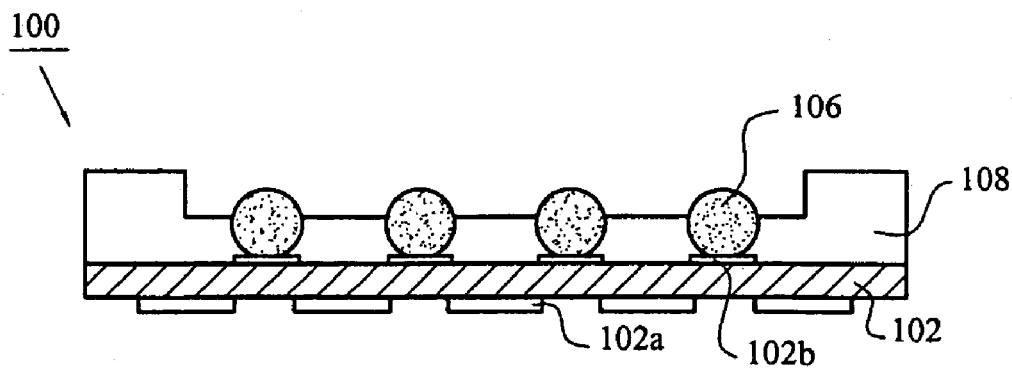
FIG. 4 is a cross-sectional view along line 4—4 of the contact sensor chip package according to the first embodiment of FIG. 1.

FIG. 3 is a cross-sectional view along line 3—3 of the contact sensor chip package according to the FIG. 1. As shown in FIG. 2 and FIG. 3, the present invention provides ground members 106 disposed close to the contact sensor chip 104, wherein the ground members 106 are electrically connected to the ground pad of the substrate 102. For example, the substrate has a plurality of ground pad 102b. Each of the ground members 106 is physically and electrically connected to each ground pad 102b. Therefore, when the static electricity is formed on the chip due to friction, the static electricity will be removed through the ground member 106. In the embodiment, the ground member 106 is a solder ball. FIG. 4 is a cross-sectional view along line 4-4 of the contact sensor chip package according to the FIG. 1. As shown in FIG. 4, the ground member 106 is higher than the contact sensor chip 104, or the elevation of the ground member 106 and the contact sensor chip 104 are the same.

Therefore, when the users' fingers contact the ground member 106, the static electricity will be removed effectively.

The encapsulation 108 covers the contact sensor chip 104 and the ground member 106, which is used for protecting the contact sensor chip 104 and the bonding wires 105. Besides, The encapsulation 108 can prevent the moisture from entering into the contact sensor chip package 100. The sensor area 104a of the contact sensor chip 104 and the top of the ground members 106 are exposed out of the encapsulation.

Figure 5:
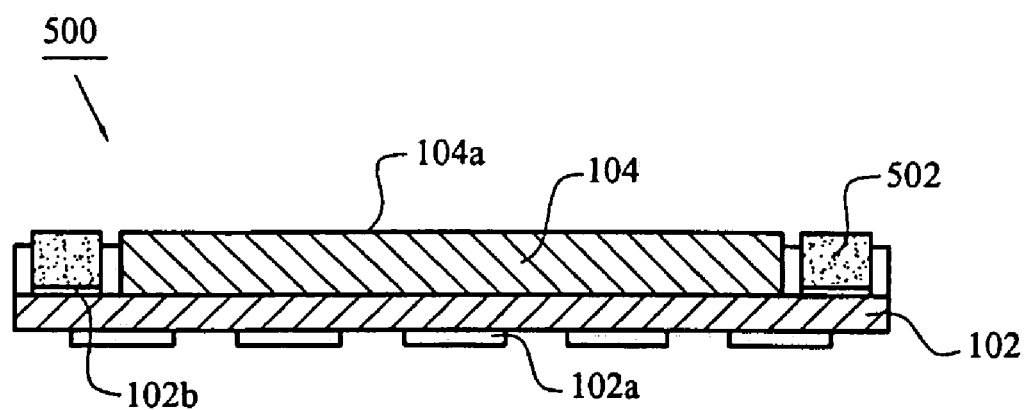
FIG. 5 is a cross-sectional view of a contact sensor chip package according to the second embodiment of the present invention.

In accordance with a second preferred embodiment as shown in FIG. 5, there is provided a contact sensor chip package 500. The ground member is a metal lump 502 disposed onto the ground pad 102b. The upper surface of the metal lump 502 is exposed out of the encapsulation 108 and the upper surface is flush with the encapsulation. The metal lump 502 is disposed on the ground pad 102a through the conductive adhesive (not shown in the figures).

Figure 6:
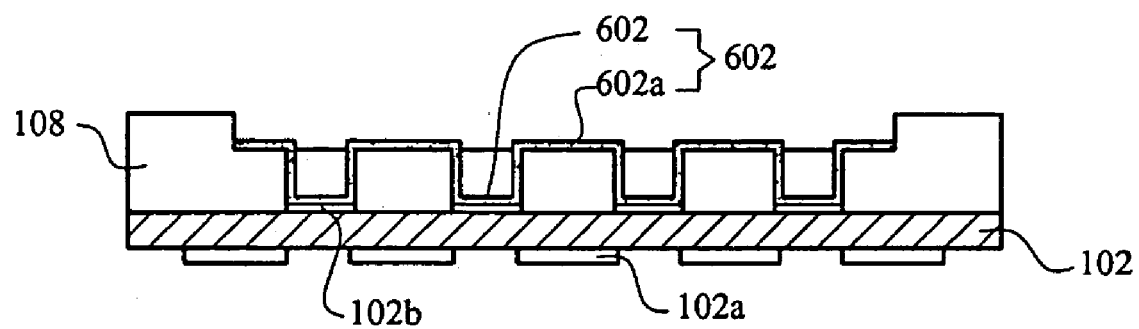
FIG. 6 is a cross-sectional view of a contact sensor chip package according to the third embodiment of the present invention.

In accordance with a third preferred embodiment as shown in FIG. 6, there is provided a contact sensor chip package 600. The ground member is a concave-convex metal plate 602 disposed on the ground pad 102b. A portion of the upper surface of the concave-convex metal plate 602 is exposed out of the encapsulation 108. The concave-convex metal plate 602 is disposed on the ground pad 102b through the conductive adhesive (not shown in the figures).

When the users contact the sensor area exposed out of the encapsulation, the static electricity produced due to friction will be eliminated through the ground member disposed on the ground pad of the substrate. Accordingly, the contact sensor chip will not be damaged by the static electricity remaining on the chip. Besides, the ground member is made of metal or high thermal conductive material, so the ground member can increase the reliability of heat dissipation.

Although the invention has been described in considerable detail with reference to certain preferred embodiments, it will be appreciated and understood that various changes and modifications may be made without departing from the spirit and scope of the invention as defined in the appended claims.

What is claimed is:

1. A contact sensor chip package, comprising:
   a substrate having a ground pad;
   a contact sensor chip disposed on the substrate, wherein the contact sensor chip has a sensor area;
   a ground member disposed on the ground pad of the substrate, wherein the ground member is electrically connected to the ground pad; and
   an encapsulation covering the contact sensor chip and the ground member, wherein the sensor area of the contact sensor chip and a portion of the ground member are exposed out of the encapsulation.

2. The contact sensor chip package of claim 1, wherein the contact sensor chip is a sliding contact sensor chip.

3. The contact sensor chip package of claim 1, wherein the contact sensor chip is a fingerprint contact sensor chip.

4. The contact sensor chip package of claim 1, wherein the top of the ground member and the upper surface of the contact sensor chip are at the same elevation.

5. The contact sensor chip package of claim 1, wherein the top of the ground member is higher than the upper surface of the contact sensor chip.

6. The contact sensor chip package of claim 1, wherein the ground member is disposed close to the contact sensor chip.

7. The contact sensor chip package of claim 1, wherein the ground member is a solder ball.

8. The contact sensor chip package of claim 1, wherein the ground member is a metal lump having an upper surface exposed out of the encapsulation and the upper surface is flush with the encapsulation.

9. The contact sensor chip package of claim 1, wherein the ground member is a concave-convex metal plate.

* * * * *